US006439253B1

(12) United States Patent
Easton

(10) Patent No.: US 6,439,253 B1
(45) Date of Patent: Aug. 27, 2002

(54) SYSTEM FOR AND METHOD OF MONITORING THE FLOW OF SEMICONDUCTOR PROCESS GASES FROM A GAS DELIVERY SYSTEM

(75) Inventor: Mark C. Easton, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/750,968

(22) Filed: Dec. 28, 2000

(51) Int. Cl.[7] .................................................. G05D 7/06
(52) U.S. Cl. ............................ 137/9; 137/88; 137/486; 137/487.5; 73/1.34
(58) Field of Search ............................ 137/486, 487.5, 137/9, 88; 73/1.34

(56) References Cited

U.S. PATENT DOCUMENTS

| | | | |
|---|---|---|---|
| 3,762,428 A | * 10/1973 | Beck et al. | 137/88 |
| 4,341,107 A | * 7/1982 | Blair et al. | 137/101.19 |
| 4,526,188 A | * 7/1985 | Olsson et al. | 137/88 |
| 4,671,097 A | * 6/1987 | Kurki et al. | 73/3 |
| 5,660,198 A | 8/1997 | McClaran | 137/12 |
| 5,803,105 A | 9/1998 | Wasson et al. | 137/1 |
| 5,853,804 A | 12/1998 | Hansen | 427/248.1 |
| 5,868,159 A | 2/1999 | Loan et al. | 137/334 |
| 5,944,048 A | 8/1999 | Bump et al. | 137/487.5 |
| 5,948,958 A | 9/1999 | Bang et al. | 73/1.36 |
| 5,975,126 A | 11/1999 | Bump et al. | 137/487.5 |
| 6,062,246 A | 5/2000 | Tanaka et al. | 137/12 |
| 6,065,492 A | 5/2000 | Bergamini | 137/487 |

* cited by examiner

Primary Examiner—Stephen Hepperle
(74) Attorney, Agent, or Firm—Downs Rachlin Martin PLLC

(57) ABSTRACT

A flow monitoring system (14) for and method of monitoring the flow of processing gases in a wafer processing system (10) during the manufacturing of microelectronic devices. The wafer processing system includes a wafer processing chamber (12) in fluid communication with a gas delivery system (18) via a common conduit (32). The gas delivery system includes a plurality of gas sources (22) each having a flow regulator (24) and a flow meter (26). The flow monitoring system includes a total flow meter (36) in fluid communication with the common conduit between the gas delivery system and the processing chamber. When a gas is flowed into wafer processing chamber from one of the gas sources, the comparator compares a first flow signal from the total flow meter to a second signal from the flow meter corresponding to the active gas source to determine whether or not the corresponding flow regulator is properly calibrated.

21 Claims, 1 Drawing Sheet

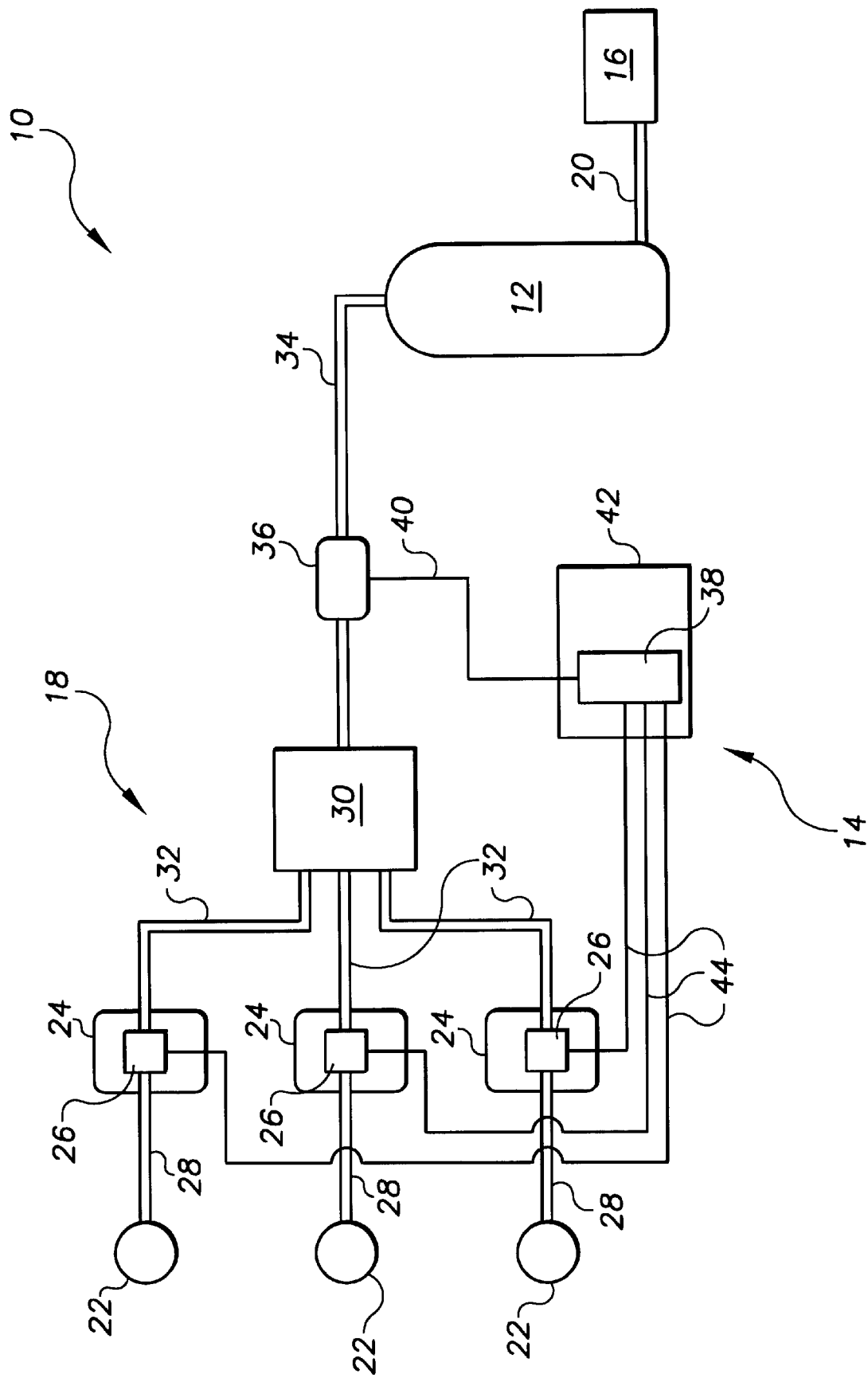

SYSTEM FOR AND METHOD OF MONITORING THE FLOW OF SEMICONDUCTOR PROCESS GASES FROM A GAS DELIVERY SYSTEM

FIELD OF INVENTION

The present invention relates generally to the field of manufacturing processes utilizing one or more process gases. More particularly, the present invention is directed to a system for and method of monitoring the flow of process gases from a gas delivery system during the manufacture of semiconductor devices to determine if the gas delivery system is properly calibrated.

BACKGROUND OF THE INVENTION

The manufacture of microelectronic devices, such as semiconductor and superconductor devices, requires precise control of the amount of one or more gases used during processing of a wafer upon which the devices are formed. Wafer processing of this sort includes subjecting the wafer to processing steps such as film deposition, doping and etching. The concentration and/or amount of processing gas(es) present in a wafer processing chamber during wafer processing can affect one or more physical properties, such as film thickness, dopant concentration and depth of etch, among others, of the structure of the microelectronic devices that have small error tolerances that must not be exceeded to produce devices that function properly. In addition, precise control of the concentration and/or amount of process gas (es) is necessary to ensure uniformity among devices produced in different processing chambers or in the same chamber but at different times. For at least these reasons, precise control of the concentration and/or amount of the process gas(es) within the processing chamber during wafer processing is vital to manufacture of such devices.

The concentration of each process gas within a process chamber is typically controlled by controlling the rate of flow of the gas into the chamber using a flow regulator, such as a mass flow controller (MFC). The MFC must be highly accurate to achieve the precise concentration of gas required for a particular processing step. To ensure the accuracy of the MFC, it must be calibrated. Whenever an MFC is new or is being used in a processing system for the first time, it undergoes an initial calibration. Subsequent to initial calibration, the MFC is re-calibrated periodically to ensure it is operating within acceptable limits.

Re-calibration of an MFC is typically performed in-situ using a "rate-of-rise" test. The rate-of-rise test generally involves flowing a purge gas into the processing chamber, pumping the processing chamber to a base pressure and then flowing a gas through the MFC for a known period of time. Based upon the known volume of the processing chamber, the temperature of the test gas, the pressure change within the chamber and the elapsed time, an empirical flow rate through the MFC may be determined. The empirical flow rate may then be compared to the design flow rate. Typically, if the difference between the empirical and design flow rates is greater than about 10% of the design flow rate, the MFC is deemed defective and is removed from service.

A drawback of this method is that there are a number of factors that can lead to a false determination that the flow regulator is out of calibration. For example, the processing chamber isolation valve located downstream of the processing chamber and/or the chamber itself may leak. In addition, the volume of the processing chamber may be diminished from its original volume due to polymer buildup or other deposition buildup on the interior of the walls of the processing chamber. Another drawback of this method is that the processing system under re-calibration must be taken out of production to perform the test.

SUMMARY OF THE INVENTION

In one aspect, the present invention is directed to a fluid delivery system for supplying at least a first fluid to a processing chamber. The fluid delivery system comprises a first flow meter located upstream of and in fluid communication with the processing chamber. The first flow meter is for generating a first flow signal. A second flow meter is located upstream of and in fluid communication with the first flow meter. The second flow meter is for measuring the flow of the first fluid. The fluid delivery system further comprises a comparator containing a comparend. The comparator is operatively coupled to the first flow meter and is adapted for comparing the first flow signal to the comparend.

In another aspect, the present invention is directed to a method of monitoring flow within a processing system. The processing system has a processing chamber, a first flow meter located upstream of and in fluid communication with the processing chamber. A second flow meter is located upstream of and in fluid communication with the first flow meter. The second flow meter is for measuring the flow of a fluid. The method comprises the steps of sensing a first flow signal at the first flow meter and comparing the first flow signal to a comparend.

BRIEF DESCRIPTION OF THE DRAWING

For the purpose of illustrating the invention, the drawing shows a form of the invention that is presently preferred. However, it should be understood that the present invention is not limited to the precise arrangements and instrumentalities shown in the drawing.

The FIGURE is a schematic view of a processing system according to the present invention.

DETAILED DESCRIPTION OF THE INVENTION

Referring now to the FIGURE, wherein like numerals indicate like elements, there is shown in accordance with the present invention a processing system, which is denoted generally by the numeral 10. Processing system 10 illustrated is a wafer processing system for manufacturing semiconductor devices. However, processing system 10 may be another type of processing system, such as a wafer processing system for manufacturing superconducting devices or a film deposition system for depositing one or more layers of film for applications other than microelectronic device manufacturing, among others.

System 10 includes a wafer processing chamber 12 that during a processing step contains one or more wafers (not shown) and one or more gases for performing the particular processing step. One skilled in the art will understand the variety of wafer processing steps, such as film deposition, doping and etching, among others, performed during wafer processing and the variety of gases used therefor. Therefore, the details of these steps and gases are not included herein. System 10 includes a flow monitoring system 14 that permits monitoring of the accuracy of the flow of gas(es) supplied to wafer processing chamber 12. Accordingly, flow monitoring system 14 provides system 10 with a number of beneficial features, several of which are described below.

System 10 further includes a vacuum system 16 and a gas, or fluid, delivery system 18. Vacuum system 16 is in fluid communication with wafer processing chamber 12 via conduit 20 and is generally provided for maintaining wafer processing chamber 12 at a particular vacuum and to exhaust the gases from the processing chamber. Vacuum system 16 may be any type of vacuum system known in the art.

Fluid delivery system 18 comprises a plurality of gas, or fluid, sources 22 for providing the one or more processing gases to wafer processing chamber 12. Although three gas sources 22 are shown in the figure, more or fewer gas sources may be provided depending upon the particular application. The flow of gas from each gas source 22 is controlled by a corresponding flow regulator 24, which may be a mass flow controller or other flow regulating device. In a preferred embodiment, flow regulator 24 includes a flow meter 26, such as a mass flow meter or coriolis-effect meter, among others. However, flow meters 26 may be separate from flow regulators 24. Each gas source 22 is in fluid communication with a corresponding flow regulator 24, e.g., via a conduit 28.

Gas delivery system 18 further includes a mixing chamber 30 where two or more gases are mixed with one another before being supplied to wafer processing chamber 12. Depending upon the particular application, mixing chamber 12 may be eliminated, e.g., if gas delivery system 18 has only one gas source 22, or may be replaced by another suitable mixing device. Each flow regulator 24 is in fluid communication with mixing chamber 30, e.g., via a conduit 32. Gas delivery system 18 is in fluid communication with wafer processing chamber 12 via a common conduit 34 that carries the total gas flow from mixing chamber 30 and, thus, the gas flow from all of gas sources 22 being used for a particular processing step.

Flow monitoring system 14 comprises a total flow meter 36 in fluid communication with common conduit 34 for measuring the gas flow through the conduit. When gas delivery system 18 includes only a sole gas source 22 or only one of a plurality of the gas sources is used for a particular process, total flow meter 36 measures, a fortiori, only the flow from that source. However, when gas delivery system 18 includes a plurality of gas sources 22 and two or more of the gas sources are supplying gases to wafer processing chamber 12 simultaneously, total flow meter 36 measures the combined flow of the two or more gases. Total flow meter 36 may be a mass flow meter, a coriolis-effect flow meter or other type of flow meter capable of accurately measuring the flow of gas within common conduit 34.

Total flow meter 36 is operatively coupled to a comparator 38 via a control cable 40. Comparator 38 may comprise a dedicated circuit or may be implemented in software running on a logic device, such as a central processing unit or custom logic chip. In a preferred embodiment, comparator 38 may be part of a system controller 42 as shown in the figure. However, comparator 38 may be separate from system controller 36 or may be integrated into another device, such as a handheld device. One skilled in the art will understand the various forms comparator 38 may have. Therefore, these forms need not be discussed in detail herein. Comparator 38 is preferably operatively coupled to each flow meter 26 of a corresponding flow regulator 24 via a control cable 44. The function of comparator 38 is described below in detail.

In a first aspect of the invention, flow monitoring system 14 may be used to monitor the flow accuracy of one of flow regulators 24 when only one gas source 22 is active. In this aspect, comparator 38 may have at least first and second modes of operation for determining whether or not the flow regulator is properly calibrated. In each mode, a first signal, such as a voltage signal from total flow meter 36 proportionate to the magnitude of flow measured by the total flow meter may be directly compared to a comparend contained within the comparator. Depending upon the type of comparator 38 used, comparend may be either an analog or digital signal. If comparend is an analog signal, it may be first flow signal or another signal that is directly proportional to the first flow signal. If comparend is a digital signal, it will have a particular digitized value corresponding, or proportional, to the magnitude of the first flow signal. One skilled in the art will understand the various forms comparend may have.

In the first mode, the comparend is a second signal, such as a voltage signal, from flow meter 26 corresponding to the active gas source 22 proportionate to the magnitude of the flow measured by flow meter 26. Optionally, an output signal may be generated by comparator 38 corresponding to the difference between the two signals to display the difference to a user via a display (not shown) and/or control system controller 42 to either shut down processing system 10 or allow gas delivery to continue. This first mode may be used either during processing of the one or more wafers or during calibration while processing system 10 is out of production.

In the second mode, the comparend to which the first signal from total flow meter 36 need is compared is a particular set point corresponding to a design flow based upon calculations, empirical data or the like for the particular process step or calibration being performed at the time of the monitoring. Optionally, an output signal may be generated by comparator 38 corresponding to the difference between the first signal and the set point to display the difference to a user via a display (not shown) and/or control system controller 42 to, e.g., shut down processing system 10, allow gas delivery to continue and/or alert a user that the flow measured by total flow meter 36 is outside of a desired range. In this second embodiment, the second signal from flow meter 26 may also be compared to the set point. Correspondingly, the difference between the first signal from total flow meter 36 and the set point and the difference between the second signal from flow meter 26 may be used to generate an output signal used to control a display and/or system controller 42.

In a second aspect of the present invention, flow monitoring system 14 may be used to measure the accuracy of the total flow of gas from gas delivery system 18 when two or more gas sources 22 are active. In this aspect, a first signal from total flow meter 36 corresponding to the total flow through common conduit 34 may be compared by comparator 38 to a set point comparend corresponding to a design flow based upon calculations, empirical data or the like for the particular process step or calibration being performed at the time of the monitoring. Optionally, an output signal may be generated by comparator 38 corresponding to the difference between the first signal and the set point to display the difference to a user via a display (not shown) and/or control system controller 42 to either shut down processing system 10 or allow gas delivery to continue.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. A fluid delivery system for supplying at least a first fluid to a processing chamber, comprising:

a. a first flow meter located upstream of and in fluid communication with the processing chamber, said first flow meter for generating a first flow signal proportionate to the magnitude of the flow of said first fluid;

b. a flow regulator located upstream of and in fluid communication with said first flow meter, said flow regulator for controlling the flow of the first fluid; and c. a comparator containing a comparend, said comparator operatively coupled to said first flow meter and adapted for comparing said first flow signal to said comparend for monitoring the flow accuracy of said flow regulator.

2. A fluid delivery system according to claim 1, wherein said comparend is a set point.

3. A fluid delivery system according to claim 1, comprising a second flow meter, wherein said second flow meter is operatively coupled to said comparator and is capable of generating a second flow signal proportionate to the magnitude of the flow of said first fluid, said comparend being proportional to said second flow signal.

4. A fluid delivery system according to claim 1, wherein said second flow meter is a part of said flow regulator.

5. A fluid delivery system according to claim 1, further comprising:

a. a plurality of flow regulators for supplying a plurality of fluids to the processing chamber; and b. a common fluid conduit fluidly coupled to said plurality of flow regulators;

c. wherein said first flow meter is in series with said common fluid conduit and said comparator is adapted for comparing said first flow signal to said comparend.

6. A fluid delivery system according to claim 1, wherein the processing chamber is a wafer processing chamber.

7. A fluid delivery system according to claim 1, wherein said comparator is part of a system controller.

8. A processing system, comprising:

a. a processing chamber; and b. a fluid delivery system, in fluid communication with said processing chamber, for delivering at least a first fluid to said processing chamber, said fluid delivery system comprising:

i. a first flow meter located upstream of and in fluid communication with said processing chamber, said first flow meter for generating a first flow signal proportionate to the magnitude of the flow of said first fluid;

ii. a flow regulator located upstream of and in fluid communication with said first flow meter, said flow regulator for controlling the flow of said first fluid; and iii. a comparator containing a comparend, said comparator operatively coupled to said first flow meter and adapted for comparing said first flow signal to said comparend for monitoring the flow accuracy of said flow regulator.

9. A processing system according to claim 8, wherein said comparend is a set point.

10. A processing system according to claim 8, comprising a second flow meter, wherein said second flow meter is operatively coupled to said comparator and is capable of generating a second flow signal proportionate to the magnitude of the flow of said first fluid, said comparend being proportional to said second flow signal.

11. A processing system according to claim 8, wherein said processing chamber is a wafer processing chamber.

12. A processing system according to claim 8, further comprising:

a. a plurality of flow regulators for supplying a plurality of fluids to said processing chamber; and b. a common fluid conduit fluidly coupled to said plurality of flow regulators;

c. wherein said fist flow meter is in series with said common fluid conduit and said comparator is adapted for comparing said first flow signal to said comparend.

13. A processing system according to claim 12, further comprising a plurality of gas sources each fluidly coupled with a corresponding one of said plurality of flow regulators.

14. A processing system according to claim 13, further comprising a mixing chamber in fluid communication with each of said flow regulators and said common fluid conduit.

15. A processing system according to claim 8, wherein said comparator is part of a system controller.

16. A processing system according to claim 8, further comprising a vacuum system located downstream of and in fluid communication with said processing chamber.

17. A method of monitoring flow within a processing system having a processing chamber, a first flow meter located upstream of and in fluid communication with the processing chamber and a flow regulator located upstream of and in fluid communication with the first flow meter, the flow regulator for controlling the flow of a fluid, the method comprising the steps of:

a. sensing a first flow signal at the first flow meter; and b. comparing said first flow signal to a comparend for monitoring the flow accuracy of said flow regulator.

18. A method according to claim 17, wherein said comparend is a set point.

19. A method according to claim 17, comprising a second flow meter, wherein the second flow meter generates a second flow signal proportionate to the magnitude of the flow of said fluid, said comparend being proportional to said second flow signal.

20. A fluid delivery system according to claim 1, wherein said flow regulator is located upstream of said first flow meter.

21. A processing system according to claim 8, wherein said flow regulator is located upstream of said first flow meter.

* * * * *